US008587338B1

(12) United States Patent
Rosen

(10) Patent No.: US 8,587,338 B1
(45) Date of Patent: Nov. 19, 2013

(54) METHOD AND APPARATUS FOR CLOCKING

(75) Inventor: Eitan Rosen, Abirim (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 107 days.

(21) Appl. No.: 13/180,932

(22) Filed: Jul. 12, 2011

Related U.S. Application Data

(63) Continuation of application No. 12/423,281, filed on Apr. 14, 2009, now Pat. No. 8,058,900.

(60) Provisional application No. 61/044,641, filed on Apr. 14, 2008.

(51) Int. Cl.
*G06F 7/38* (2006.01)

(52) U.S. Cl.
USPC .................. 326/40; 326/28; 326/38; 326/93; 327/114; 327/144; 327/145; 327/158

(58) Field of Classification Search
USPC .......... 326/37, 38, 40, 93; 327/155, 144, 145, 327/142, 158
See application file for complete search history.

(56) References Cited

U.S. PATENT DOCUMENTS

| 5,630,100 | A | * | 5/1997 | Ganapathy et al. ............. 703/14 |
| 5,811,992 | A | | 9/1998 | D'Souza |
| 6,087,886 | A | | 7/2000 | Ko |
| 6,121,816 | A | | 9/2000 | Tonks et al. |
| 6,157,694 | A | | 12/2000 | Larsson |
| 6,163,545 | A | * | 12/2000 | Flood et al. .................... 370/465 |
| 6,255,883 | B1 | | 7/2001 | Delvaux et al. |
| 6,411,135 | B2 | | 6/2002 | Komoto |
| 6,489,825 | B1 | | 12/2002 | Pasqualini |
| 6,542,013 | B1 | * | 4/2003 | Volk et al. ...................... 327/115 |
| 6,566,967 | B1 | * | 5/2003 | Anumula et al. ................ 331/11 |
| 6,674,772 | B1 | | 1/2004 | Daily et al. |
| 6,690,309 | B1 | | 2/2004 | James et al. |
| 6,906,558 | B2 | | 6/2005 | Lee et al. |
| 6,960,937 | B1 | | 11/2005 | Nguyen |
| 6,963,236 | B2 | * | 11/2005 | Berkram et al. .............. 327/238 |
| 6,975,154 | B1 | | 12/2005 | Pedersen |
| 6,987,406 | B1 | * | 1/2006 | Chiu .............................. 327/156 |
| 6,995,584 | B1 | | 2/2006 | Nguyen et al. |
| 7,024,324 | B2 | | 4/2006 | Rifani et al. |
| 7,075,351 | B2 | * | 7/2006 | Berkram et al. .............. 327/238 |
| 7,106,099 | B1 | * | 9/2006 | Nix ................................ 326/40 |
| 7,119,596 | B2 | * | 10/2006 | Kong et al. .................... 327/261 |
| 7,120,844 | B2 | | 10/2006 | Wu |
| 7,126,404 | B1 | | 10/2006 | Rosen |
| 7,202,698 | B1 | | 4/2007 | Bauer et al. |

(Continued)

*Primary Examiner* — Linh Nguyen

(57) ABSTRACT

Aspects of the disclosure provide a clock gate circuit for generating a clock signal. The clock gate circuit includes a multiplexer and a logic module coupled to the multiplexer. The multiplexer is configured to receive a first logic signal at a first data input, a second logic signal at a second data input, and a reference clock signal at a selector input, and to output the clock signal having a logic state selected from one of the first logic signal or the second logic signal based on transitions of the reference clock signal. The logic module includes at least one of an XNOR and an XOR module and is configured to provide an output signal that is responsive to performing at least one of an XNOR and an XOR operation of the output of the multiplexer and an enable signal that enables or disables the clock gate circuit to generate the clock signal.

22 Claims, 7 Drawing Sheets

(56) References Cited

U.S. PATENT DOCUMENTS

| | | |
|---|---|---|
| 7,240,266 B2 | 7/2007 | Farmer et al. |
| 7,259,598 B2 | 8/2007 | Wu et al. |
| 7,265,638 B2 | 9/2007 | Osvaldella |
| 7,404,116 B2 | 7/2008 | Wang |
| 7,461,304 B1 | 12/2008 | Rosen |
| 7,525,341 B1 | 4/2009 | Rosen et al. |
| 7,652,516 B2 | 1/2010 | Bourstein et al. |
| 7,808,271 B2 | 10/2010 | Rosen et al. |
| 7,932,768 B2 | 4/2011 | Stoler et al. |
| 7,948,268 B2 | 5/2011 | Rosen et al. |
| 2002/0175704 A1 | 11/2002 | Young et al. |
| 2003/0151433 A1 | 8/2003 | Takai |
| 2004/0008055 A1 | 1/2004 | Khanna et al. |
| 2004/0196081 A1 | 10/2004 | Srinivasan et al. |
| 2004/0240274 A1 | 12/2004 | Ku |
| 2006/0076996 A1* | 4/2006 | Gouin et al. .................. 327/261 |
| 2006/0104399 A1* | 5/2006 | Byun et al. ..................... 375/376 |
| 2006/0154434 A1* | 7/2006 | Das et al. ...................... 438/393 |
| 2007/0096774 A1 | 5/2007 | Yang et al. |
| 2008/0129360 A1* | 6/2008 | Truong et al. ................. 327/259 |
| 2008/0143397 A1 | 6/2008 | Xia |

\* cited by examiner

METHOD AND APPARATUS FOR CLOCKING

INCORPORATION BY REFERENCE

This application is a continuation of U.S. patent application Ser. No. 12/423,281 filed Apr. 14, 2009, which claims the benefit U.S. Provisional Application No. 61/044,641, "Clocking with a Half Rate Clock" filed on Apr. 14, 2008. The disclosures of the prior applications are incorporated herein by reference in their entirety.

BACKGROUND

Clock signals are generally used in integrated circuits (ICs), and may be used, for example, for the purpose of timing control, synchronization, and the like. Clock signals can be provided by a clock system, which may include various clock circuits, such as clock generation circuit, clock driving circuit, and the like. Conventionally, a device on an IC, such as a flip-flop, is responsive to one type of edges, either rising edges or falling edges, of a clock signal.

SUMMARY

Aspects of the disclosure can provide methods and apparatuses for generating clock signals. Generally, clock signals may need to satisfy various requirements, such as logic requirements and timing requirements. According to the disclosure, the logic requirements and the timing requirements of the clock signals can be satisfied by separately configuring a logic module and a multiplexer module. In accordance with an embodiment of the disclosure, suitable configuration of the logic module and the multiplexer module may enable the capture of data at any rising or falling edge of a clock signal. Moreover, the multiplexer module may be configured so that its rising edges and falling edges are mutually balanced so as to alleviate timing differences between rising and falling clock edges as found in conventional devices.

Aspects of the disclosure can provide a clock gate circuit for generating a clock signal. The clock gate circuit can include a multiplexer configured to receive a first logic signal at a first data input, a second logic signal at a second data input, and a reference clock signal at a selector input, and to output the clock signal having a logic state selected from one of the first logic signal or the second logic signal based on transitions of the reference clock signal. Further, the clock gate circuit can include a logic module coupled to the multiplexer and configured to output the first logic signal and the second logic signal based on an enable signal and the output of the multiplexer.

According to an embodiment of the disclosure, the multiplexer can be configured as a time-balanced multiplexer having time balanced rising edge and falling edge with regard to the selector input, as described in Applicant's copending U.S. patent application Ser. No. 11/093,080, which is incorporated herein by reference in its entirety. Thus, transitions of the clock signal output by the multiplexer can have a substantially constant delay to the transitions of the reference clock signal.

According to another embodiment of the disclosure, the multiplexer can be configured to output the clock signal having the logic state selected from the first logic signal in response to rising transitions of the reference clock signal, and the second logic signal in response to falling transitions of the reference clock signal.

Further, the logic module can include a first latch module and a second latch module. The first latch module can be configured to capture the first logic signal in response to the rising transitions of the reference clock signal and sustain the first logic signal. Similarly, the second latch module can be configured to capture the second logic signal in response to the falling transitions of the reference clock signal and sustain the second logic signal.

According to an aspect of the disclosure, the logic module can further include at least one of XNOR and XOR modules configured to receive the enable signal and the output of the multiplexer, and provide an output signal for the first latch module and the second latch module to capture.

According to another aspect of the disclosure, the logic module can include a first voltage pulling module configured to force the first logic signal into a logic state, and a second voltage-pulling module configured to force the second logic signal into the logic state. Further, the logic module can include a delay module configured to start operations of the first voltage pulling module or the second voltage-pulling module with a delay to transitions of the clock signal. In addition, the delay module can be software controllable.

Aspects of the disclosure can provide a method for generating a clock signal. The method can include receiving a reference clock signal as a selector input of a multiplexer, generating a first logic signal as a first data input of the multiplexer based on an enable signal and an output of the multiplexer, generating a second logic signal as a second data input of the multiplexer based on the enable signal and the output of the multiplexer, and multiplexing the first logic signal and the second logic signal in response to the reference clock signal to generate the clock signal. More specifically, the first logic signal can be selected for outputting in response to a rising transition of the reference clock signal, and the second logic signal can be selected for outputting in response to a falling transition of the reference clock signal.

Further, the method can include outputting the first logic signal with a first delay to the rising transition of the reference clock signal, and outputting the second logic signal with a second delay to the falling transition of the reference clock signal. In an example, the first delay and the second delay can be substantially equal.

According to an aspect of the disclosure, the method can include capturing and sustaining the first logic signal by a first latch in response to the rising transitions of the reference clock, and capturing and sustaining the second logic signal by a second latch in response to the falling transitions of the reference clock.

In an embodiment, the method can include generating a signal for capturing based on the output of the multiplexer and the enable signal.

To generate the signal for capturing based on the output of the multiplexer and the enable signal, the method can include XNORing the output of the multiplexer and the enable signal. Alternatively, the method can include XORing the feedback of the clock signal and the enable signal.

In another embodiment, the method can include voltage-pulling up/down to force the first logic signal into a logic state, and voltage-pulling up/down to force the second logic signal into the logic state.

Further, the method can include delaying the voltage-pulling for the first logic signal with regard to a first transition of the clock signal, and delaying the voltage pulling for the second logic signal with regard to a second transition of the clock signal.

Aspects of the disclosure can provide an integrated circuit (IC) chip. The IC chip can include a dual-edge flip-flop configured to sample a data input at both a rising edge and a falling edge of an enabled clock input. Further, the IC chip can include an enabled clock generator configured to generate an enabled clock signal as the enabled clock input for the dual-edge flip-flop, based on a reference clock signal and an enable signal. The enabled clock generator can include a multiplexer configured to receive a first enabled logic signal at a first data input, a second enabled logic signal at a second data input, and the reference clock signal at a selector input, and to output the enabled clock signal having a logic state selected from one of the first enabled logic signal or the second enabled logic signal based on transitions of the reference clock signal. In addition, the enabled clock generator can include an enabling logic module coupled to the multiplexer and configured to output the first enabled logic signal and the second enabled logic signal based on the enable signal and the output of the multiplexer.

According to an embodiment of the disclosure, the multiplexer can be a time-balanced multiplexer having time balanced rising edge and falling edge with regard to the selector input, as described in Applicant's copending U.S. patent application Ser. No. 11/093,080, which is incorporated herein by reference in its entirety.

Aspects of the disclosure can provide another integrated circuit (IC) chip. The IC chip can include a clock source configured to provide a half rate clock signal, a clock tree for propagating the half rate clock signal, and at least a full rate clock generator configured to generate a full rate clock signal based on the half rate clock signal. The full rate clock generator can include a logic module configured to provide a first pulse logic signal in response to rising transitions of the half rate clock signal, and a second pulse logic signal in response to falling transitions of the half rate clock signal. Further, the full rate clock generator can include a first multiplexer configured to receive the first pulse logic signal from a first data input, the second pulse logic signal from a second data input, and the half rate clock signal from a selector input, and output one of the first pulse logic signal or the second pulse logic signal as the full rate clock signal based on the half rate clock signal.

According to an embodiment of the disclosure, the first multiplexer can be a time-balanced multiplexer having time balanced rising edge and falling edge with regard to the selector input, as described in Applicant's copending U.S. patent application Ser. No. 11/093,080, which is incorporated herein by reference in its entirety. Thus, the pulses of full rate clock signal can have a substantially constant delay to the transitions of the half rate clock.

In addition, the full rate logic module can further include a first voltage pulling module configured to force the first logic pulse signal to a logic state for shaping the first logic pulse signal of a pulse, and a second voltage-pulling module configured force the second logic pulse signal to a logic state for shaping the second logic pulse signal of a pulse.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
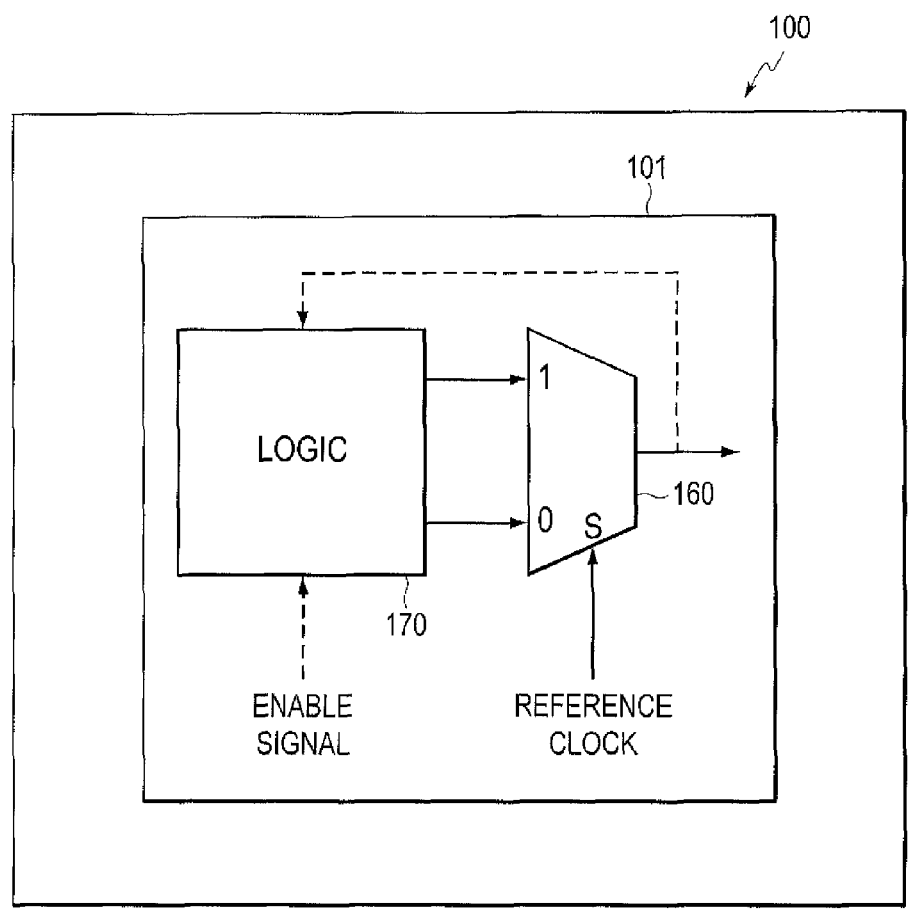
FIG. 1 shows a simplified block diagram of an integrated circuit (IC) chip example including a clock gate circuit according to an embodiment of the disclosure.

FIG. 1 shows a simplified block diagram of an integrated circuit (IC) chip example including a clock gate circuit according to an embodiment of the disclosure. The IC chip 100 can include a clock gate circuit 101 for generating a clock signal based on a reference clock signal. The clock gate circuit 101 can include a logic module 170 and a multiplexer 160. Theses elements can be coupled together as shown in FIG. 1.

The logic module 170 can provide a first logic signal and a second logic signal to the multiplexer 160. The logic module 170 can include any suitable circuits, such as static logic circuits, dynamic logic circuits, combinational circuits, sequential circuits, and the like. In an example, the logic module 170 can generate the first logic signal and the second logic signal based on an input signal, such as an enable signal, and the like. In another example, the logic module 170 may generate the first logic signal and the second logic signal based on a present state and/or a previous state of the clock signal. Additionally, the logic module 170 may generate the first logic signal and the second logic signal based on the reference clock signal.

The multiplexer 160 can receive the first logic signal from a first data input, and the second logic signal from a second data input. Further, the multiplexer 160 may receive the reference clock signal from a selector input. Then, the multiplexer 160 can output the clock signal by multiplexing the first logic signal and the second logic signal based on the reference clock signal. For example, the multiplexer 160 may select the first logic signal for outputting in response to a rising transition of the reference clock signal, and select the second logic signal for outputting in response to a falling transition of the reference clock signal.

According to an aspect of the disclosure, clock signals of the IC chip 100 may need to satisfy various requirements, such as logic requirements and timing requirements. The logic requirements and the timing requirements of a clock signal can be satisfied by respectively configuring the logic module 170 and the multiplexer 160 of the clock gate circuit 101. More specifically, the logic module 170 can be configured to implement the logic requirements of the clock signal, and the multiplexer 160 can be configured to implement the timing requirements of the clock signal.

In an example, the clock signal may be required to have time balanced rising edges and falling edges with respect to the reference clock signal. Accordingly, the multiplexer 160 can be configured as a time-balanced multiplexer having time balanced rising edge and falling edge with regard to the selector input, as described in Applicant's copending U.S. patent application Ser. No. 11/093,080, which is incorporated herein by reference in its entirety. Thus, rising edges and falling edges of the clocks signal can be time balanced with regard to the reference clock signal.

Figure 2:
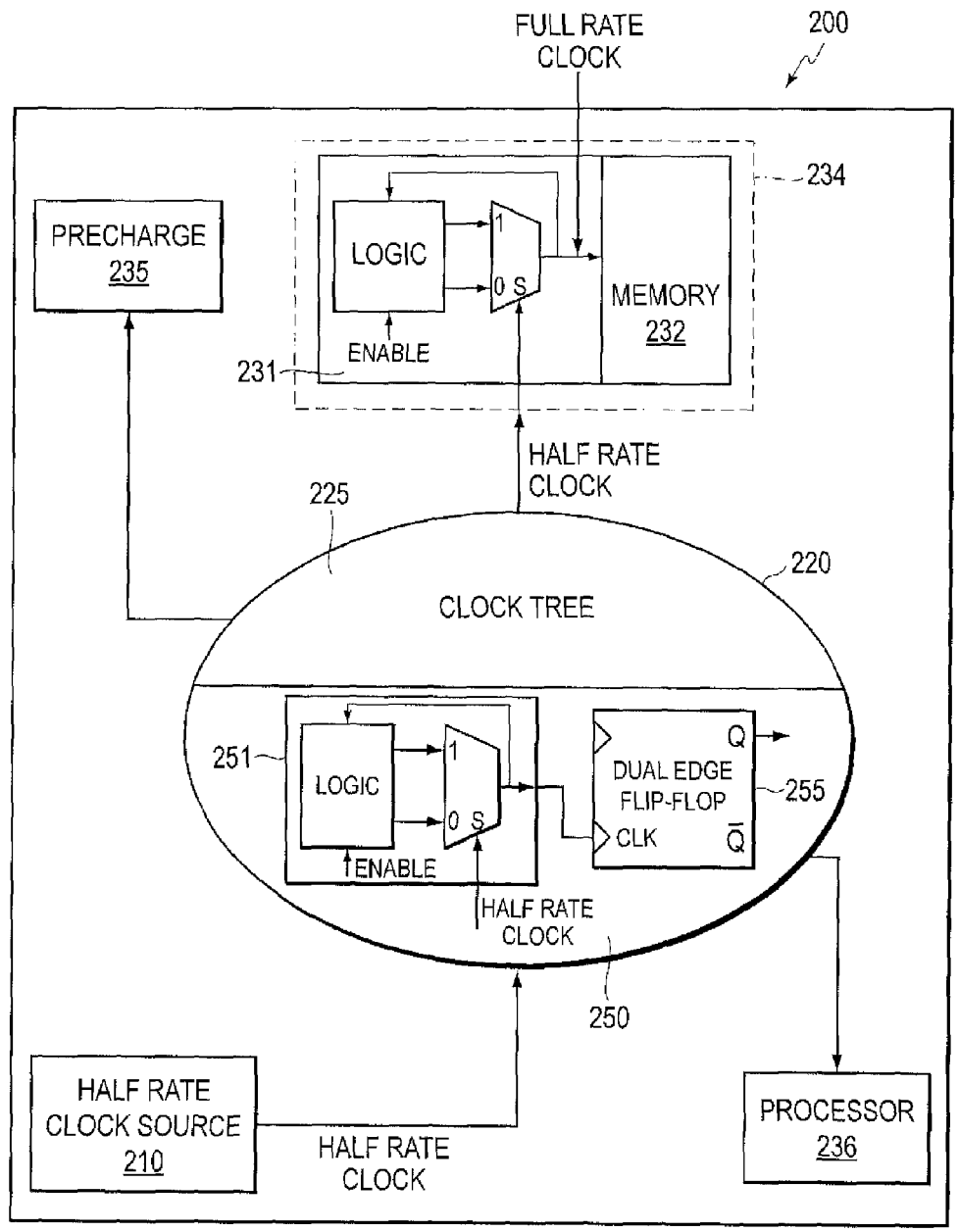
FIG. 2 shows a more detailed block diagram of an IC chip example according to an embodiment of the disclosure.

FIG. 2 shows a more detailed block diagram of an IC chip example according to an embodiment of the disclosure. The IC chip 200 may include a clock system that may use a half rate system clock. The half rate system clock can be converted locally to a full rate clock for local circuits that may operate under the full rate clock. The IC chip 200 can have a reduced power consumption, for example, due to dynamic power reduction by using the half rate system clock. The IC chip 200 may include a half rate clock source module 210, a clock tree and dual-edge flip-flop module 220, and a plurality of functional circuit modules 234-236. These elements can be coupled together as shown in FIG. 2.

The half rate clock source module 210 may provide a system clock signal with a reduced frequency, for example, a half rate clock signal. The half rate clock signal may have a frequency that is half of an operational frequency for functional circuits, such as memory circuits, processor circuits, and the like. In an embodiment, the half rate clock source module 210 may include a clock generator to generate the half rate clock signal. In another embodiment, the half rate clock source module 210 may receive an external clock signal, and may provide the half rate clock signal based on the external clock signal.

The clock tree and dual-edge flip-flop module 220 may receive the system clock, which is the half rate clock signal in this case, and propagate the half rate clock signal across the IC chip 200 to local locations of the plurality of functional circuit modules 234-236. In addition, the clock tree and dual-edge flip-flop module 220 may include dual-edge flip-flops, for example, for data sampling. The dual-edge flip-flops may sample data using both rising edges and falling edges of a sampling clock signal. According to the disclosure, the sampling clock signal may have logic requirements and timing requirements. For example, the sampling clock signal may be required to stop transitions in response to an enable signal being logic "0" in order to disable sampling.

Dual-edge clocking, such as dual-edge flip-flops, are beneficial to IC designs in various aspects. In an example, the dual-edge flip-flops can double throughput without using a twice higher frequency clock. In another example, the dual-edge flip-flops can enable a design with a half rate clock to save power, while maintaining original throughput. However, the dual-edge clocking may require complex clock designs. For example, to disable operations of a dual-edge flip-flop, the clock to the dual-edge flip-flop may need to stop toggling, rather than be forced into zero (or one in some cases) in a related art. The present disclosure can facilitate the clock design for the dual-edge flip-flops and can make practical dual edge clocking feasible.

According to an embodiment of the disclosure, the clock tree and dual-edge flip-flop module 220 may include a clock gate circuit 251 for generating the sampling clock signal based on the enable signal and the half rate clock signal. The clock gate circuit 251 can include a logic module and a multiplexer coupled together. The logic module can be configured to implement the logic requirements of the sampling clock signal, and the multiplexer can be configured to implement the timing requirements of the sampling clock signal.

The plurality of functional circuit modules 234-236 may include circuits that can operate under an operational clock. The operational clock can be a full rate clock, which can have twice the frequency of the system clock. In an example, the circuits may be implemented by using macros in an existing design library that is designed for operating under the full rate clock. Additionally, the operational clock may be required to be time balanced, for example, to optimize delay margins of the circuits. For example, the functional circuit module 234 can include a memory block 232. The memory block 232 can be an existing custom macro that may be designed to operate under a frequency that is twice the frequency of the half rate clock signal.

According to an embodiment of the disclosure, the plurality of functional circuit modules 234-236 may respectively include a local clock controller. The local clock controller can receive the system clock, which is the half rate clock in this case, and generate the operational clock for the local functional circuit modules. For example, the functional circuit module 234 may include a local clock controller 231. Further, the local clock controller 231 can include a clock gate circuit that can include a logic module and a multiplexer coupled together to generate the operational clock. According to an aspect of the disclosure, the logic module can be configured to implement the logic requirements of the operational clock, and the multiplexer can be configured to implement the timing requirements of the operational clock.

Figure 3:
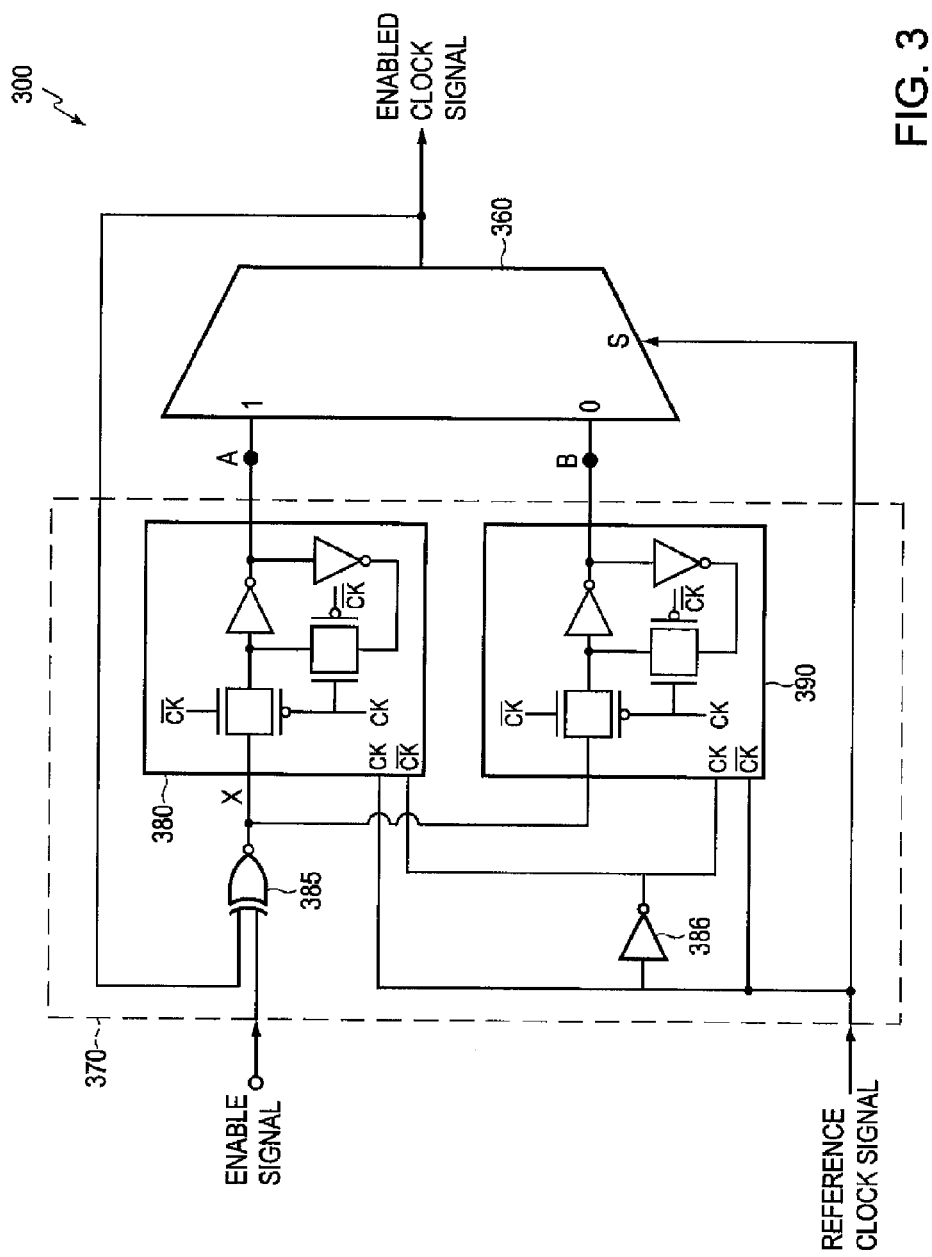
FIG. 3 shows a block diagram of a clock gate circuit example for generating an enabled clock signal according to an embodiment of the disclosure.

FIG. 3 shows a block diagram of a clock gate circuit example for generating an enabled clock signal according to an embodiment of the disclosure. The clock gate circuit 300 can receive an enable signal and a reference clock signal, and generate an enabled clock signal based on the enable signal and the reference clock signal. The enabled clock signal can be used to drive a dual-edge flip-flop, such that the dual-edge flip-flop can sample data in response to the enable signal. The clock gate circuit 300 can include a logic module 370 and a multiplexer 360 coupled together as shown in FIG. 3.

The logic module 370 can include any suitable circuit components to implement the logic requirements for the enabled clock signal. In the example of FIG. 3, the logic module 370 may include a XNOR gate 385, an inverter 386, a first latch 380 and a second latch 390. These elements can be coupled together as shown in FIG. 3.

The XNOR gate 385 can generate a signal at node X based on the enable signal and a feedback of the enabled clock signal. More specifically, when the enable signal is logic "1", the node X can be the same as the enabled clock signal; and when the enable signal is logic "0", the node X can be an inverse of the enabled clock signal.

The first latch 380 and the second latch 390 can be respectively configured into a pass mode and a sustain mode with respect to the reference clock signal. In the pass mode, the first latch 380 can pass the signal at the node X to node A, which is a first data input of the multiplexer 360; and the second latch 390 can pass the signal at the node X to node B, which is a second data input of the multiplexer 360. When a latch switches from the pass mode to the sustain mode, a last state of the signal being passed can be captured and sustained. In the sustain mode, the first latch 380 can sustain a last state of the signal being passed to the node A; and the second latch 390 can sustain a last state of the signal being passed to the node B.

More specifically, when the reference clock signal is "0", the first latch 380 is configured in the pass mode, and the second latch 390 is configured in the sustain mode, thus the signal at the node X can be inversely passed to the node A, and the last state of the signal being passed to the node B can be sustained. When the reference clock signal is "1", the first latch 380 is configured in the sustain mode, and the second latch 390 is configured in the pass mode, thus the signal at the node X can be inversely passed to the node B, and the last state of the signal being passed to the node A can be sustained.

The inverter 386 can receive the reference clock signal, and output an inverse of the reference clock signal. The inverse of the reference clock signal and the reference clock signal can be provided to the first latch 380 and the second latch 390 to control operation timings, such as when to pass the signal at the node X, when to capture the last state of the passed signal, when to sustain the last state captured, and the like.

The multiplexer 360 can receive the first data input from the node A, the second data input from the node B, and a selector input from the reference clock signal. Then, the multiplexer 360 can select one of the first data input or the second data input for outputting based on the selector input. More specifically, when the reference clock signal is logic "1", the multiplexer 360 can select the first data input for outputting; and when the reference clock signal is logic "0", the multiplexer 360 can select the second data input for outputting.

During operation, the enable signal can be logic "1" or logic "0". When the enable signal is logic "1", the clock gate circuit 300 may output the enabled clock signal that switches between logic "1" and logic "0". When the enable signal is logic "0", the clock gate circuit 300 may output the enabled clock signal that can stay at a last state before the enable signal became logic "0".

More specifically, when the enable signal is logic "1", the signal at the node X can be the same as the enabled clock signal, due to the logic operation of the XNOR gate 385, and the enable signal having logic "1". When the reference clock signal is logic "0", the first latch 380 can be configured in the pass mode that can inversely pass the signal at node X to the node A, thus the node A can be an inverse of the enabled clock signal; and the second latch 390 can be configured in the sustain mode that can sustain the last state of the signal being passed to the node B. In addition, the sustained last state of the signal being passed to the node B can be selected for outputting by the multiplexer 360, because the reference clock signal is logic "0".

When the reference clock signal switches from logic "0" to logic "1", the first latch 380 can switch from the pass mode to the sustain mode, thus the last state, which is the inverse of the enabled clock signal, can be captured and sustained. In addition, the multiplexer 360 can switch to select the first data input for outputting, which is the inverse of the enabled clock signal, thus the enabled clock signal can transit to its inverse.

Because the enabled clock signal changes, the signal at the node X changes in the same manner as the result of the logic operation of the XNOR gate 385 and the enable signal having logic "1". Further, the first latch 380 can switch from the pass mode to the sustain mode to sustain the state at the node A. The second latch 390 can switch from the sustain mode to the pass mode, thus inversely pass the signal at the node X to the node B, which can be the inverse of the present enabled clock signal.

When the reference clock signal switches back to logic "0", the second latch 390 can switch from the pass mode to the sustain mode, thus the last state, which is the inverse of the present enabled clock signal, can be captured and sustained. In addition, the multiplexer 360 can switch to select the second data input for outputting, which is the inverse of the present enabled clock signal, thus the enabled clock signal can transit to its inverse, which can include transiting from logic "0" to logic "1", or transiting from logic "1" to logic "0".

On the other hand, when the enable signal is logic "0", the signal at the node X can be the inverse of the enabled clock signal, due to the logic operation of the XNOR gate 385, and the enable signal having logic "0". When the reference clock signal is logic "0", the first latch 380 can be configured in the pass mode that can inversely pass the signal at node X to the node A, thus the node A can be the same as the enabled clock signal. The second latch 390 can be configured in the sustain mode that can sustain the last state of the signal being passed to the node B. In addition, the sustained last state of the signal being passed to the node B can be selected for outputting by the multiplexer 360, because the reference clock signal is logic "0".

When the reference clock signal switches from logic "0" to logic "1", the first latch 380 can switch from the pass mode to the sustain mode, thus the last state of the signal being passed to the node A, which is the same as the present state of the enabled clock signal, can be captured and sustained. In addition, the multiplexer 360 can switch to select the first data input for outputting, which is the same as the present state of the enabled clock signal, thus the enabled clock signal does not switch.

Because the enabled clock signal does not change, the signal at the node X does not change. The first latch 380 can switch from the pass mode to the sustain mode to sustain the last state of the signal being passed to the node A, which is the same as the state of the enabled clock signal. The second latch 390 can switch from the sustain mode to the pass mode, thus inversely pass the signal at the node X to the node B, which can be the same as the present enabled clock signal.

Therefore, when the enable signal is logic "0", even the reference clock signal switches between logic "1" and logic "0", the enabled clock signal can stay in its last state, either logic "1" or logic "0" without switching.

In an embodiment of the disclosure, the multiplexer 360 can be configured as a time-balanced multiplexer having time balanced rising edge and falling edge with regard to the selector input, as described in Applicant's copending U.S. patent application Ser. No. 11/093,080, which is incorporated herein by reference in its entirety. Thus, rising edges and falling edges of the enabled clock signal can be time balanced with regard to the reference clock signal.

Figure 4:
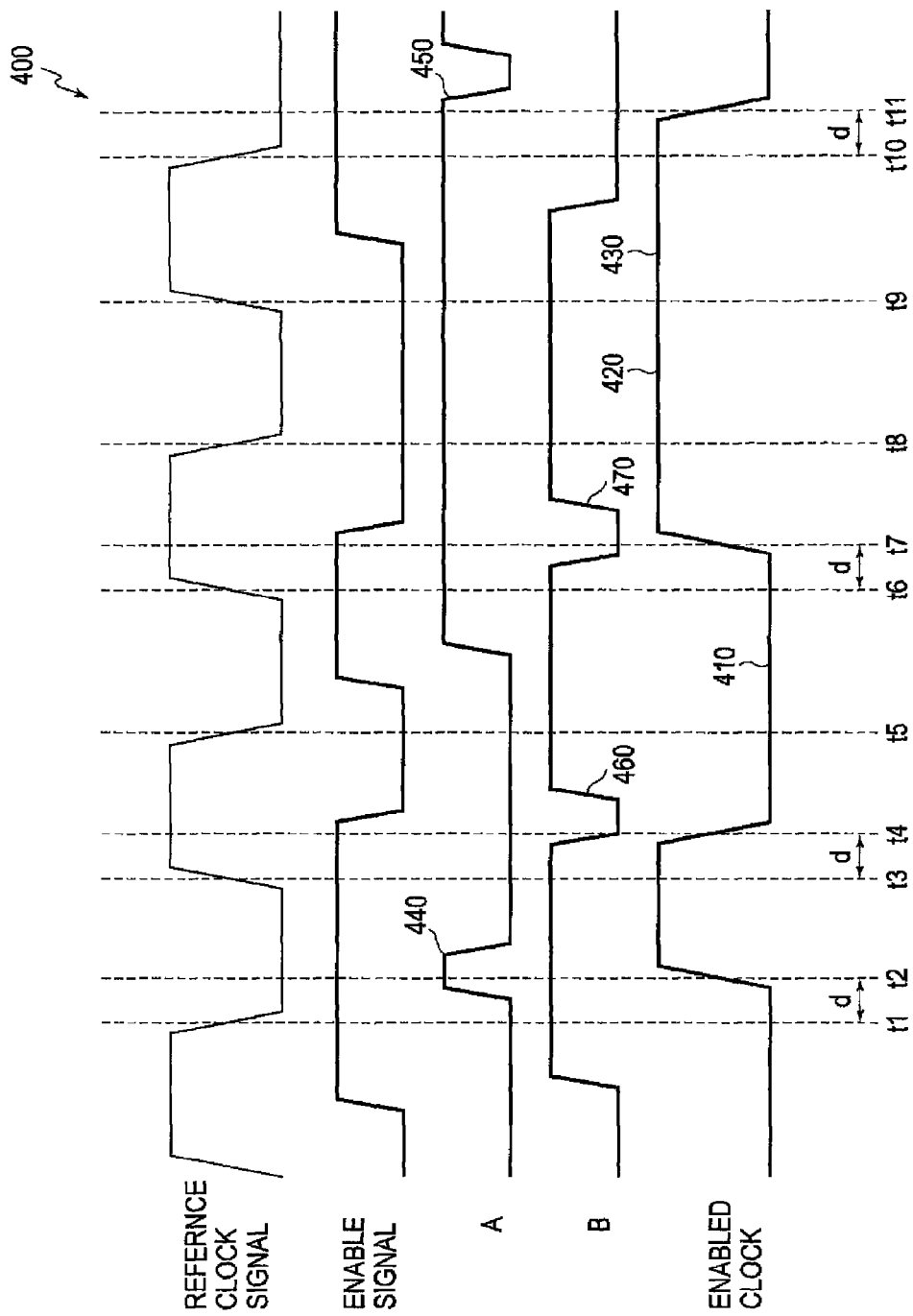
FIG. 4 shows a plot of waveform examples for the clock gate circuit example in FIG. 3.

FIG. 4 shows a plot of waveform examples for the clock gate circuit 300. The plot 400 can include waveforms for the reference clock signal, the enable signal, the first data input at the node A, the second data input at the node B, and the enabled clock signal.

When the enable signal is logic "1", the enabled clock signal may switch with regard to the transitions of the reference clock signal. For example, the reference signal may transit from logic "1" to logic "0" at time t1. Accordingly, the multiplexer 360 may switch from selecting the first data input from node A for outputting to selecting the second data input from node B for outputting. Thus, the enabled clock signal may transit from logic "0" to logic "1" at time t2. According to an embodiment of the disclosure, the multiplexer 360 can be configured as a time-balanced multiplexer, as described in Applicant's copending U.S. patent application Ser. No. 11/093,080, which is incorporated herein by reference in its entirety. Therefore, the transition of the enabled clock signal can have a substantially constant delay, shown by d in FIG. 4, to the transition of the reference clock signal.

Similarly, when the reference clock signal transits from logic "0" to logic "1" at time t3, the enabled clock signal may transit from logic "1" to logic "0" accordingly. According to an embodiment of the disclosure, the delay between the transition of the enabled clock signal and the reference clock signal can be the substantially constant delay, as shown by d in FIG. 4.

However, when the enable signal is logic "0", the enabled clock signal may stay in its last state before the enable signal becomes logic "0", even though the reference clock signal may transit between logic "1" and logic "0". For example, at time t5, the reference clock signal may transit from logic "1" to logic "0". Because the enable signal is logic "0", the enabled clock signal can stay in logic "0", as shown by 410 in FIG. 4.

Similarly, at time t8 and t9, although the reference clock signal transits between logic "1" and logic "0", the enabled clock signal can stay in its last state without transitions, as shown by 420 and 430 in FIG. 4.

When the enable signal returns to logic "1", the enabled clock signal may resume to transit with regard to the transitions of the reference clock signal. For example, at time t6, the reference clock signal may transit from logic "0" to logic "1". Because the enable signal has returned to logic "1", the enabled clock signal can transit from logic "0" to logic "1" at time t7. According to an embodiment of the disclosure, the delay between the transition of the enabled clock signal and the reference clock signal can be the substantially constant delay, as shown by d in FIG. 4.

Similarly, at time t10, the reference clock signal may transit from logic "1" to logic "0". Because the enable signal has returned to logic "1", the enabled clock signal can transit from logic "1" to logic "0" at time t11. According to an embodiment of the disclosure, the delay between the transition of the enabled clock signal and the reference clock signal can be the substantially constant delay, as shown in FIG. 4.

It is noted that the first data input from the node A may vary when the first latch 380 is configured in the pass mode (when the reference clock signal is in logic "0"), as shown by 440 and 450. Those variations are caused by, for example, delays of the multiplexer 360, delays of the feedback path from the multiplexer 360 to the XNOR gate 385, and the like. However, those variations may not affect the enabled clock signal, because the multiplexer 360 selects the second input from the node B, which is sustained by the second latch 390 at the time. Similar variations can be seen for the second data input from node B when the second latch 390 is configured in the pass mode (when the reference clock signal is in logic "1"), as shown by 460 and 470.

Figure 5:
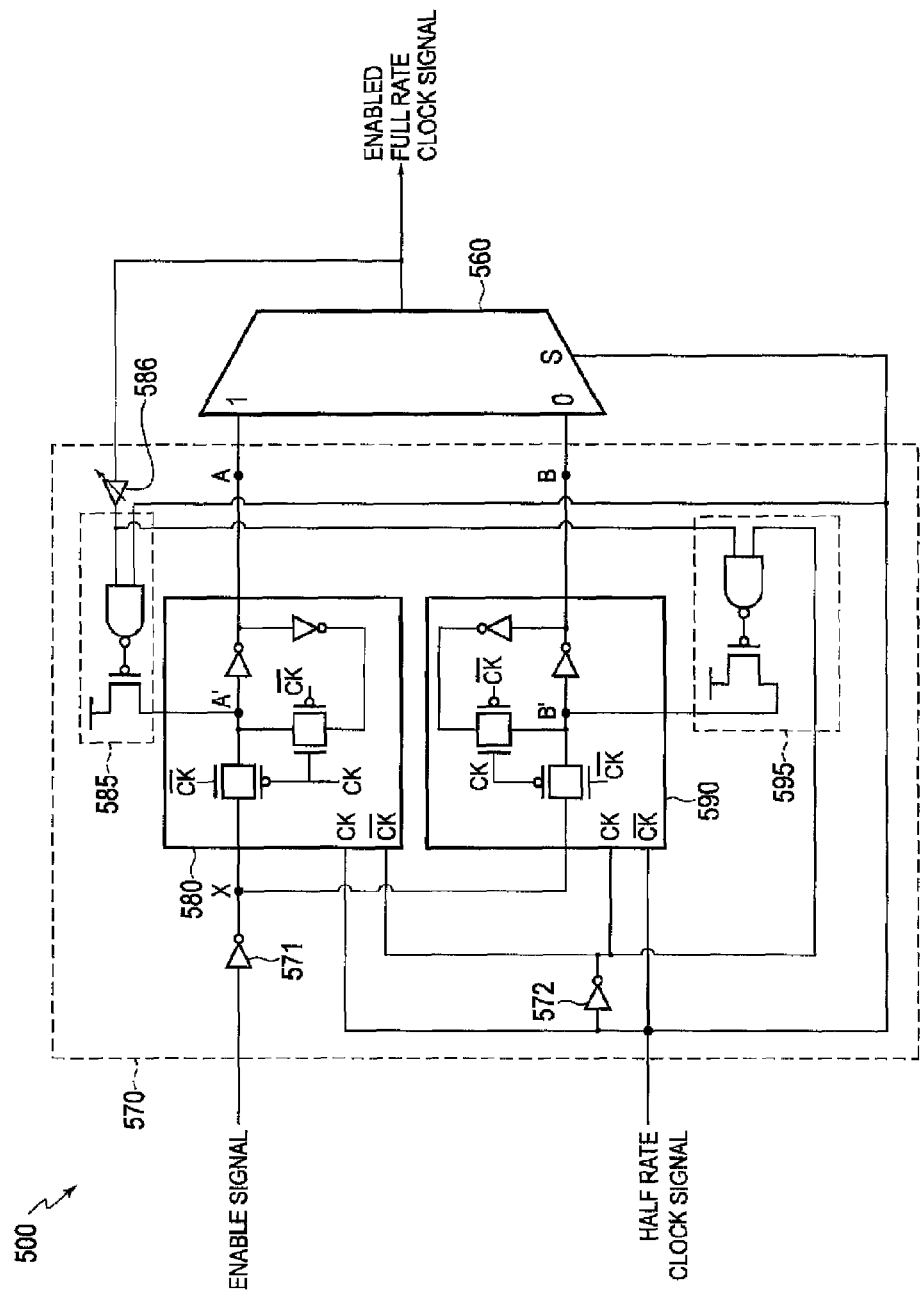
FIG. 5 shows a block diagram of a clock gate circuit example for generating an enabled full rate clock signal from a half rate clock signal according to an embodiment of the disclosure.

FIG. 5 shows a block diagram of a clock gate circuit example for generating an enabled full rate clock signal from a half rate clock signal according to an embodiment of the disclosure. The clock gate circuit 500 can receive an enable signal and a half rate clock signal, and generate an enabled full rate clock signal based on the enable signal and the half rate clock signal. The clock gate circuit 500 can include a logic module 570 and a multiplexer 560 coupled together as shown in FIG. 5.

The logic module 570 can include any suitable circuit components to implement the logic requirements for generating the enabled full rate clock signal. In the example of FIG. 5, the logic module 570 may include a first inverter 571, a second inverter 572, a first latch 580, a second latch 590, a first pull-up module 585, a second pull-up module 595, and a delay element 586. These elements can be coupled together as shown in FIG. 5.

The first inverter 571 can receive the enable signal and provide an inverse of the enable signal at node X. The second inverter 571 can receive the half rate clock signal and provide an inverse of the half rate clock signal. The inverse of the half rate clock signal and the half rate clock signal can be provided to the first latch 580 and the second latch 590 to control the latch operations.

The first latch 580 and the second latch 590 can be respectively configured into a pass mode and a sustain mode with respect to the half rate clock signal. In the pass mode, the first latch 580 can pass the signal at the node X to node A, which is a first data input of the multiplexer 560; and the second latch 590 can pass the signal at the node X to node B, which is a second data input of the multiplexer 560. Generally, when a latch switches from the pass mode to the sustain mode, a last state of the signal being passed can be captured and then sustained by the latch. When the first latch 580 switches from the pass mode to the sustain mode, the first latch 580 can capture and sustain a last state of the signal being passed to the node A; and when the second latch 590 switches from the pass mode to the sustain mode, the second latch 590 can capture and sustain a last state of the signal being passed to the node B.

More specifically, when the reference clock signal is "0", the first latch 580 is configured in the pass mode, and the second latch 590 is configured in the sustain mode, thus the signal at the node X can be inversely passed to the node A, and a last state of the signal being passed to the node B can be sustained. When the reference clock signal is "1", the first latch 580 is configured in the sustain mode, and the second latch 590 is configured in the pass mode, thus the signal at the node X can be inversely passed to the node B, and a last state of the signal being passed to the node A can be sustained.

The multiplexer 560 can receive the first data input from the node A, the second data input from the node B, and a selector input from the reference clock signal. Then, the multiplexer 560 can select one of the first data input or the second data input for outputting based on the selector input. More specifically, when the reference clock signal is logic "1", the multiplexer 560 can select the first data input for outputting; and when the reference clock signal is logic "0", the multiplexer 560 can select the second data input for outputting.

The first pull-up module 585 can be configured to pull up a voltage at node A', thus a state at node A can be pulled to logic "0". The second pull-up module 595 can be configured to pull up a voltage at node B', thus a state at node B can be pulled to logic "0". The delay element 586 can be configured to delay the pull-up operations of the first pull-up module 585 and the second pull-up module 595 with regard to a feedback of the enabled full rate clock signal. In embodiment, the delay element 586 can be a variable delay element. Further, the delay of the delay element 586 can be software controllable.

During operation, the enable signal can be logic "1" or logic "0". When the enable signal is logic "1", the clock gate circuit 500 may output the enabled full rate clock signal with a pulse in response to each transition of the half rate clock signal. When the enable signal is logic "0", the clock gate circuit 500 may output the enabled clock signal with constant logic "0".

More specifically, when the enable signal is logic "1", the signal at the node X can be logic "0", due to the first inverter 571 and the enable signal having logic "1". When the half rate clock signal switches from logic "1" to logic "0", the second latch 590 can switch from the pass mode to the sustain mode, thus the last state being passed to the node B, which is logic "1", can be captured. At first, the second latch 590 may sustain logic "1" at the node B. The sustained logic "1" at the node B can be selected for outputting by the multiplexer 560. Thus, the enabled full rate clock signal can transit to logic "1". Because the enabled full rate clock being logic "1", the second pull-up module 595 may pull up the voltage at node B' after a delay controlled by the delay element 586, and may force the state at node B into logic "0". Further, the logic "0" at node B can be selected for outputting by the multiplexer 560, because the half rate clock signal is logic "0". Thus, the enabled full rate clock signal can return to logic "0". Therefore, the enabled full rate clock signal can transit a pulse in response to the half rate clock signal switching from logic "1" to logic "0".

When the half rate clock signal switches from logic "0" to logic "1", the first latch 580 can switch from the pass mode to the sustain mode, thus the last state being passed to the node A, which is logic "1", can be captured. At first, the first latch 580 may sustain logic "1" at the node A. The sustained logic "1" at the node A can be selected for outputting by the multiplexer 560. Thus, the enabled full rate clock signal can transit to logic "1". Because the enabled full rate clock being logic "1", the first pull-up module 585 may pull up the voltage at node A' after a delay controlled by the delay element 586, and may force the state at node A into logic "0". Further, the logic "0" at node A can be selected for outputting by the multiplexer 560, because the half rate clock signal is logic "1". Thus, the enabled full rate clock signal can return to logic "0". Therefore, the enabled full rate clock signal can transit a pulse in response to the half rate clock signal switching from logic "0" to logic "1".

On the other hand, when the enable signal is logic "0", the signal at the node X can be logic "1", The logic "1" at the node X can be inversely passed to the node A and node B by the first latch 580 and the second latch 590. Thus, the node A and the node B can be logic "0". Therefore, no matter the half rate clock signal switches from logic "0" to logic "1", or from logic "1" to logic "0", the multiplexer 560 can output logic "0". Thus, the enabled full rate clock signal can stay at logic "0".

In an embodiment of the disclosure, the multiplexer 560 can be configured as a time-balanced multiplexer having time balanced rising edge and falling edge with regard to the selector input, as described in Applicant's copending U.S. patent application Ser. No. 11/093,080, which is incorporated herein by reference in its entirety. Thus, each pulse of the enabled full rate clock signal can have a substantially constant delay to a transition of the half rate clock signal.

It is noted that while voltage pull-up modules are used in the FIG. 5 example, the clock gate circuit 500 can be suitably adjusted to use voltage pull-down modules as well.

Figure 6:
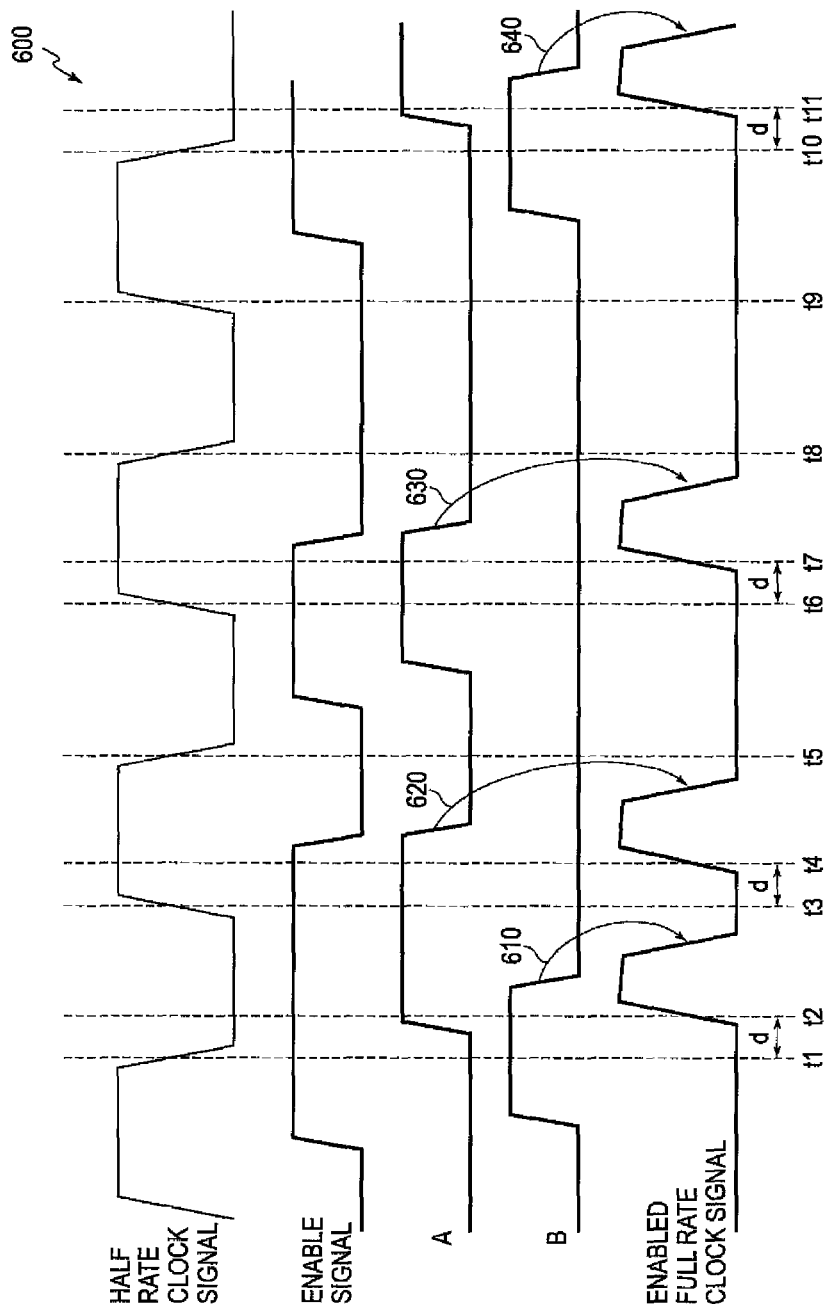
FIG. 6 shows a plot of waveform examples for the clock gate circuit example in FIG. 5.

FIG. 6 shows a waveform example for the clock gate circuit example in FIG. 5. The plot 600 can include wavefolins for the half rate clock signal, the enable signal, the first data input at the node A, the second data input at the node B, and the enabled full rate clock signal.

When the enable signal is logic "1", the enabled full rate clock signal may transit a pulse with regard to each transition of the half rate clock signal. For example, the half rate clock signal may transit from logic "1" to logic "0" at time t1. Accordingly, the multiplexer 560 may switch from selecting the first data input from node A for outputting to selecting the second data input from node B for outputting. Thus, the enabled full rate clock signal may transit from logic "0" to logic "1" at time t2. According to an embodiment of the disclosure, the multiplexer 560 can be configured as a time-balanced multiplexer, as described in Applicant's copending U.S. patent application Ser. No. 11/093,080, which is incorporated herein by reference in its entirety. Therefore, the rising transition of the enabled full rate clock signal can have a substantially constant delay, shown by d in FIG. 4, to the transition of the half rate clock signal.

Further, the second pull-up module may pull up voltage at node B', and force the state at node B to logic "0". Thus, the enabled full rate clock signal may return to logic "0", as shown by 610 in FIG. 6.

Similarly, when the half rate clock signal transits from logic "0" to logic "1" at time t3, the enabled full rate clock signal may transit from logic "0" to logic "1" accordingly. According to an embodiment of the disclosure, the delay between the rising transition of the enabled full rate clock signal and the half rate clock signal can be the substantially constant delay, as shown by d in FIG. 6.

However, when the enable signal is logic "0", the enabled full rate clock signal may stay in logic "0", even though the half rate clock signal may transit between logic "1" and logic "0". For example, at time t5, the half rate clock signal may transit from logic "1" to logic "0". Because the enable signal is logic "0", the enabled clock signal can stay in logic "0".

Similarly, at time t8 and t9, although the half rate clock signal transits between logic "1" and logic "0", the enabled full rate clock signal can stay in logic "0".

When the enable signal returns to logic "1", the enabled full rate clock signal may resume to transit a pulse with regard to each transition of the half rate clock signal. For example, at time t6, the half rate clock signal may transit from logic "0" to logic "1". Because the enable signal has returned to logic "1", the enabled full rate clock signal can transit a pulse from time t7.

Similarly, at time t10, the half rate clock signal may transit from logic "1" to logic "0". Because the enable signal has returned to logic "1", the enabled full rate clock signal can transit a pulse from time t11.

Figure 7:
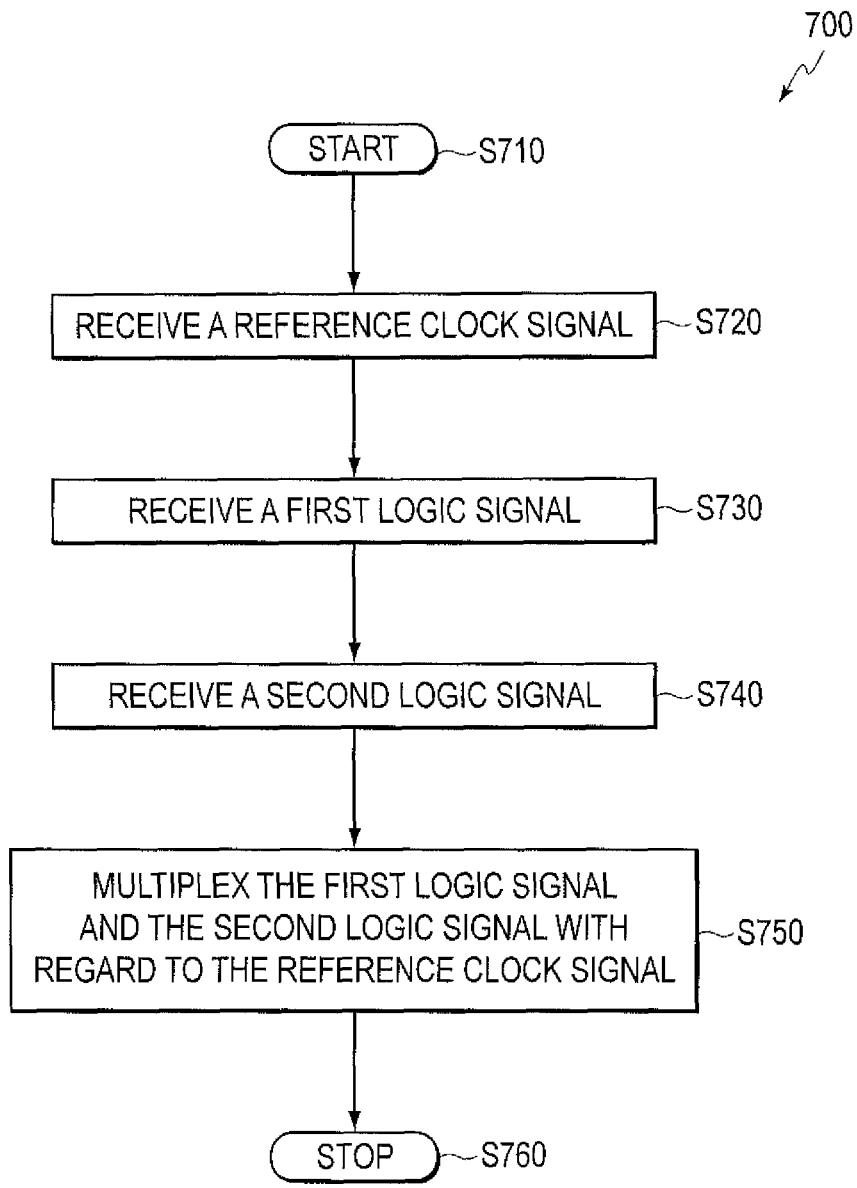
FIG. 7 shows a flow chart outlining a process example for generating a clock signal according to an embodiment of the disclosure.

FIG. 7 shows a flow chart outlining a process example for generating a clock signal according to an embodiment of the disclosure. The process starts at step S710, and proceeds to step S720.

In step S720, a multiplexer may receive a reference clock signal at a selector input. Then, the process proceeds to step S730.

In step S730, the multiplexer may receive a first logic signal from a first data input. According to the disclosure, the first logic signal can be provided by a logic module. The logic module may include various circuit to provide the first logic signal. For example, the logic module may include various logic gates, such as AND, OR, NAND, NOR, XOR, XNOR, INV, and the like. In addition, the logic module may include latches, flip-flops to capture and sustain the first logic signal. Further, the logic module may include pull-up and pull-down modules that can force the first logic signal into certain states. Also, the logic module may include delay modules that can be used to shape the first logic signal. The delay modules can be variable delay modules, and the delay of the delay modules can be software controllable. In an embodiment, the logic module may generate the first logic signal based on an enable signal and an output from the multiplexer. Then, the process proceeds to step S740.

In step S740, the multiplexer may receive a second logic signal from a second data input. According to the disclosure, the second logic signal can also be provided by the logic module. In an embodiment, the logic module may generate the second logic signal based on the enable signal and the output of the multiplexer. In addition, the logic module may include latches, flip-flops to capture and sustain the first logic signal. Further, the logic module may include pull-up and pull-down modules that can force the second logic signal into certain states. Also, the logic module may include delay modules that can be used to shape the second logic signal. The delay modules can be variable delay modules, and the delay of the delay modules can be software controllable. Then, the process proceeds to step S750.

In step S750, the multiplexer may multiplexing the first logic signal and the second logic signal based on the reference clock signal. In an embodiment of the disclosure, the multiplexer 560 can be configured as a time-balanced multiplexer having time balanced rising edge and falling edge with regard to the selector input, as described in Applicant's copending U.S. patent application Ser. No. 11/093,080, which is incorporated herein by reference in its entirety. Thus, the output signal can have a substantially constant delay to transitions of the reference clock signal. Then, the process proceeds to step S760 and terminates.

It is noted that the above process is described in steps for ease of description, the multiplexer and the logic module can be configured to perform the above steps at the same time, and at all time.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A clock gate circuit for generating a clock signal, comprising:
    a multiplexer configured to receive a first logic signal at a first data input, a second logic signal at a second data input, and a reference clock signal at a selector input, the first logic signal and the second logic signal both being generated based on the reference clock signal, and to output the clock signal having a logic state selected from one of the first logic signal or the second logic signal based on transitions of signal levels of the reference clock signal; and
    a logic module coupled to the multiplexer, wherein the logic module includes at least one of an XNOR and an XOR module and is configured to provide an output signal that is responsive to performing at least one of an XNOR and an XOR operation of the output of the multiplexer and an enable signal that enables or disables the clock gate circuit to generate the clock signal.

2. The clock gate circuit according to claim 1, wherein the logic module is configured to generate the first logic signal and the second logic signal based on an output of at least one of the XNOR and the XOR module.

3. The clock gate circuit according to claim 1, wherein the multiplexer is a time-balanced multiplexer, such that transitions of signal levels of the clock signal have a substantially constant delay to the transitions of signal levels of the reference clock signal.

4. The clock gate circuit according to claim 2, wherein the multiplexer is further configured to output the clock signal having the logic state selected from the first logic signal in response to rising transitions of the reference clock signal, and the second logic signal in response to falling transitions of the reference clock signal.

5. The clock gate circuit according to claim 4, wherein the logic module further comprises:
    a first latch module configured to capture the output of at least one of the XNOR module and the XOR module as the first logic signal in response to the rising transitions of the reference clock signal and sustain the first logic signal; and
    a second latch module configured to capture the output of at least one of the XNOR module and the XOR module as the second logic signal in response to the falling transitions of the reference clock signal and sustain the second logic signal.

6. A method for generating a clock signal, comprising:
    receiving a reference clock signal as a selector input of a multiplexer;
    generating a first logic signal and a second logic signal both based on the reference clock signal;
    multiplexing the first logic signal received at a first data input of the multiplexer and the second logic signal received at a second data input of the multiplexer in response to transitions of signal levels of the reference clock signal to generate the clock signal; and
    performing at least one of an XNOR operation or an XOR operation of the generated clock signal and an enable signal that enables or disables the clock signal.

7. The method of claim 6, further comprising:
    generating the first logic signal based on an output of at least one of the XNOR operation and the XOR operation; and
    generating the second logic signal based on the output of at least one of the XNOR operation and the XOR operation.

8. The method according to claim 7, wherein multiplexing the first logic signal received at the first data input of the multiplexer and the second logic signal received at the second data input of the multiplexer in response to the reference clock signal to generate the clock signal, further comprises:
    outputting the first logic signal with a first delay to rising transitions of the reference clock signal; and
    outputting the second logic signal with a second delay to falling transitions of the reference clock signal.

9. The method according to claim 8, wherein the first delay and the second delay are substantially equal.

10. The method according to claim 7, further comprising:
    capturing and sustaining the first logic signal by a first latch in response to rising transitions of the reference clock; and
    capturing and sustaining the second logic signal by a second latch in response to falling transitions of the reference clock.

11. An integrated circuit, (IC) chip, comprising:
    a dual-edge flip-flop configured to sample a data input at both a rising edge and a falling edge of an enabled clock input; and
    an enabled clock generator configured to generate an enabled clock signal as the enabled clock input for the dual-edge flip-flop, based on a reference clock signal and an enable signal that enables or disables the enabled clock generator to generate the enabled clock signal, wherein the enabled clock generator further comprises:
        a multiplexer configured to receive a first enabled logic signal at a first data input, a second enabled logic signal at a second data input, and the reference clock signal at a selector input, the first enabled logic signal and the second enabled logic signal both being generated based on the reference clock signal, and to output the enabled clock signal having a logic state selected from one of the first enabled logic signal or the second enabled logic signal based on transitions of signal levels of the reference clock signal; and
        an enabling logic module coupled to the multiplexer, wherein the enabling logic module includes at least one of an XNOR module and an XOR module and is configured to provide an output signal that is responsive to performing at least one of an XNOR operation and an XOR operation of the enable signal and the enabled clock signal.

12. The IC chip according to claim 11, wherein the enabling logic module is configured to generate the first enabled logic signal and the second enabled logic signal based on output of at least one of the XNOR module and the XOR module.

13. The IC chip according to claim 11, wherein the multiplexer is a time-balanced multiplexer, such that transitions of signal levels of the enabled clock signal have a substantially constant delay to the transitions of signal levels of the reference clock signal.

14. The IC chip according to claim 11, wherein the enabling logic module further comprises:
- a first latch module configured to capture the output of at least one of the XNOR module and the XOR module as the first enabled logic signal in response to rising transitions of the reference clock signal and sustain the first enabled logic signal; and
- a second latch module configured to capture the output of at least one of the XNOR module and the XOR module as the second enabled logic signal in response to falling transitions of the reference clock signal and sustain the second enabled logic signal.

15. A clock gate circuit for generating a clock signal, comprising:
- a multiplexer configured to receive a first logic signal at a first data input, a second logic signal at a second data input, and a reference clock signal at a selector input, the first logic signal and the second logic signal both being generated based on the reference clock signal, and to output the clock signal having a logic state selected from one of the first logic signal or the second logic signal based on transitions of signal levels of the reference clock signal to cause that a clock frequency of the clock signal is a function of a frequency of the reference clock signal, the first logic signal and the second logic signal both being generated based on the reference clock signal;
- a logic module coupled to the multiplexer and configured to output the first logic signal and the second logic signal based on an enable signal and the output of the multiplexer.

16. The clock gate circuit according to claim 15, wherein the multiplexer is a time-balanced multiplexer, such that transitions of signal levels of the clock signal have a substantially constant delay to the transitions of signal levels of the reference clock signal.

17. The clock gate circuit according to claim 15, wherein the multiplexer is further configured to output the clock signal having the logic state selected from the first logic signal in response to rising transitions of the reference clock signal, and the second logic signal in response to falling transitions of the reference clock signal.

18. The clock gate circuit according to claim 17, wherein the logic module further comprises:
- a first latch module configured to capture the first logic signal in response to the rising transitions of the reference clock signal and sustain the first logic signal; and
- a second latch module configured to capture the second logic signal in response to the falling transitions of the reference clock signal and sustain the second logic signal.

19. The clock gate circuit according to claim 18, wherein the logic module further comprises:
- at least one of XNOR and XOR modules configured to receive the enable signal and the output of the multiplexer, and provide an output signal for the first latch module and the second latch module to capture.

20. The clock gate circuit according to claim 18, wherein the logic module further comprises:
- a first voltage pulling module configured to force the first logic signal into a logic state; and
- a second voltage-pulling module configured to force the second logic signal into the logic state.

21. The clock gate circuit according to claim 20, wherein the logic module further comprises:
- a delay module configured to start the first voltage-pulling module or the second voltage-pulling module with a delay to transitions of signal levels of the clock signal.

22. The clock gate circuit according to the claim 21, wherein the delay module is software controllable.

* * * * *